United States Patent
Roberts et al.

(10) Patent No.: US 6,375,694 B1
(45) Date of Patent: *Apr. 23, 2002

(54) POLISHING SLURRY COMPOSITIONS CAPABLE OF PROVIDING MULTI-MODAL PARTICLE PACKING

(75) Inventors: John V. H. Roberts, Newark, DE (US); Lee Melbourne Cook, Steelville, PA (US); William D. Budinger, Wilmington, DE (US)

(73) Assignee: Rodel Holdings Inc., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/575,787

(22) Filed: May 22, 2000

Related U.S. Application Data (63) Continuation of application No. 09/131,261, filed on Aug. 7, 1998, now Pat. No. 6,093,649.
(60) Provisional application No. 60/055,149, filed on Aug. 8, 1997.

(51) Int. Cl.$^7$ .............................. C09K 3/14; C09G 1/02; C09G 1/04

(52) U.S. Cl. .............................. 51/309; 51/307; 51/308; 106/3; 438/692; 438/693

(58) Field of Search .......................... 51/307, 308, 309; 106/3; 438/692, 693

(56) References Cited

U.S. PATENT DOCUMENTS

| | | | |
|---|---|---|---|
| 4,356,107 A | * 10/1982 | Payne | ........................ 51/308 |
| 5,302,233 A | 4/1994 | Kim et al. | |
| 5,389,194 A | 2/1995 | Rostoker et al. | |
| 5,527,423 A | 6/1996 | Neville et al. | |
| 5,626,715 A | 5/1997 | Rostoker | |
| 5,665,127 A | * 9/1997 | Moltgen et al. | ............... 51/293 |
| 6,093,649 A | * 7/2000 | Roberts et al. | ............. 438/691 |

* cited by examiner

*Primary Examiner*—Michael Marcheschi
(74) *Attorney, Agent, or Firm*—Konrad Kaeding; Gerald K. Kita; Kenneth A. Benson (57) ABSTRACT

Water based polishing slurries, comprising oxide polishing particles. The polishing slurries comprise an innovative (multi-modal) particle distribution for improved polishing performance.

22 Claims, 6 Drawing Sheets

POLISHING SLURRY COMPOSITIONS CAPABLE OF PROVIDING MULTI-MODAL PARTICLE PACKING

This application is a continuation of application Ser. No. 09/131,261 filed Aug. 7, 1998 U.S. Pat. No. 6,093,649 which claims the benefit of U.S. Provisional Application No. 60/055,149 filed Aug. 8, 1997.

BACKGROUND OF THE INVENTION

1. Field of the Invention

The present invention relates generally to water based polishing slurries, comprising oxide polishing particles. More specifically, the polishing slurries of the present invention comprise an innovative (multi-modal) particle distribution for improved polishing performance.

2. Discussion of the Prior Art

U.S. Pat. No. 5,626,715 to Rostoker describes an aluminum oxide particle distribution for use in polishing semiconductor substrates. Although the methods described in Rostoker are useful, they are increasingly inadequate in meeting the ever increasing demands of the semiconductor industry. The slurries of Rostoker do not provide the efficiency and selectivity which are now possible in accordance with the present invention.

SUMMARY OF THE INVENTION

The slurries of the present invention comprise slurry particles in which at least 90 weight percent, more preferably at least 95 weight percent, yet more preferably at least 98 weight percent, yet more preferably at least 99.5 weight percent and yet more preferably 100 weight percent of the particles are within the range of 10 nanometers to 500 nanometers, more preferably 10 nanometers to 400 nanometers, yet more preferably 10 nanometers to 300 nanometers and yet more preferably 10 nanometers to 100 nanometers.

The slurry particles of the present invention are preferably oxides, particularly ceria, alumina and/or silica. The slurry particles of the present invention are further defined as having a multi-modal size distribution, comprising a first size distribution curve having a first asymptote indicating a first particle size and a second distribution curve adjacent or overlapping (preferably adjacent) the first distribution curve, the second distribution curve having a second asymptote indicating a larger particle size. The large particle size (second asymptote) divided by the small particle size (first asymptote) is preferably in the range of 1.05–5000 more preferably 1.1–1000, yet more preferably 1.5–500 and yet more preferably 2–100.

It has been surprisingly discovered that such a multi-modal particle distribution provides improved polishing performance, because improved particle packing at the polishing interface is possible. Furthermore, the polishing slurries of the present invention tend to have less (lot-to-lot) performance variability, relative to many conventional mono-modal slurries, because variability in each distribution curve tend to cancel each other out as particles representing multiple distribution curves are combined, provided particles near the extremes (10 nanometers and 600 nanometers) are kept to a minimum.

DETAILED DESCRIPTION OF THE PREFERRED EMBODIMENT(S)

The present invention is directed to an improved technique for polishing semiconductor devices. The present invention is particularly well suited for:

1. planarizing layers in semiconductor devices, particularly in the removal of excess material, such as, metal overfilling vias;
2. removing layers in a semiconductor device as a prelude to reworking or repairing a defective layer in the device;
3. removing top layers of a semiconductor device without damaging preexisting topology, returning the wafer, undamaged, to a truly pre-existing state;
4. chemical mechanical polishing of substrates such as metal damascene;
5. polishing polyimide films, CVD TEOS layers, or dielectric layers such as polymeric low k dielectric films and silicon dioxide;
6. polishing or removing material from a semiconductor substrate in a manner tailored to produce a resulting substrate surface which is either substantially planar or which is substantially conformal to underlying layers.

The above operations can be accomplished by polishing with the polishing slurries of the present invention. The slurries of the present invention comprise slurry particles having advantageous particle size distributions. The particles size distributions of the present invention allow for improved particle packing at the polishing interface, and such improved particle packing provides improved polishing surface interaction.

Figure 4:
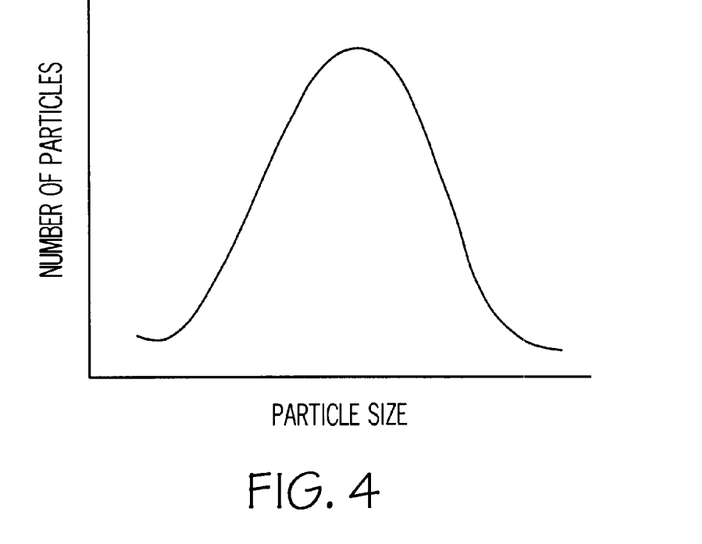
FIG. 4 is a graphical representation of a prior art slurry, having a mono-modal particle size distribution.

Conventional slurries typically have mono-modal particle distributions, such as is illustrated in FIG. 4. With a mono-modal particle distribution, the particles are predominantly within a single size range and the further a particle (size) is from the median, the less prevalent the particle. For mono-modal particle distributions, it has been surprisingly discovered that particles at the extreme low end of the range tend to decrease polishing efficiency, and particles at the extreme high end of the range tend to cause unwanted scratching or other defects on the polishing surface. Furthermore, it has been surprisingly discovered that a mono-modal particle distribution provides inferior particle packing at the interface relative to the present invention.

The methods and compositions of the present invention preferably comprise oxide particles, particularly aluminum oxide ($Al_2O_3$), silica ($SiO_2$), cerium oxide, and titanium dioxide. Preferred aluminum oxide particles are in an alpha ($\alpha$) state, but other forms of aluminum oxide (e.g., gamma state, and pure $Al_2O_3$) may be used. The silica is preferably amorphous, although crystalline and semicrystalline may be acceptable in certain applications of the present invention.

Figure 5:
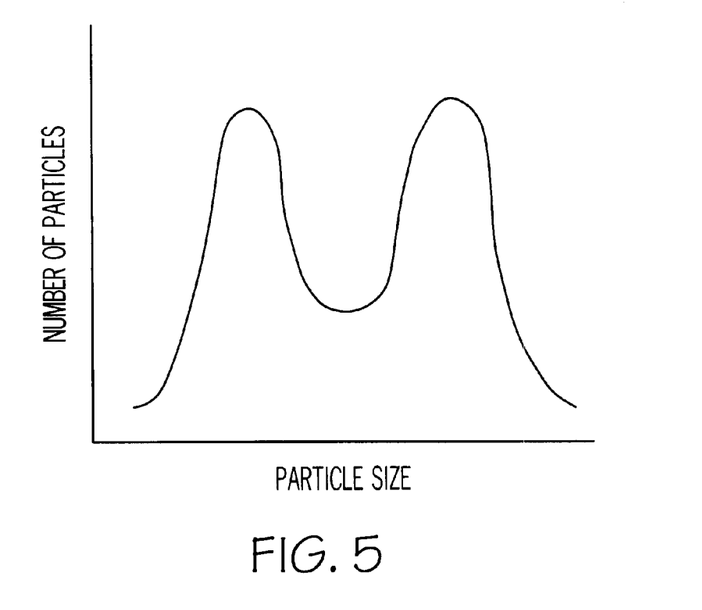
FIG. 5 is a graphical representation of a slurry in accordance with the present invention, having a multi-modal particle size distribution.

In accordance with the present invention, the oxide particles have a multi-modal particle size distribution as illustrated in FIG. 5. This Figure illustrates a graph having "particle size" delineated along a horizontal axis and "number of particles" delineated along the vertical axis. The graphical representation of the particle size distributions of the present invention comprise at least two Gaussian curves. The first Gaussian curve comprises a peak (asymptote) at a particle size which is at least 10% less than the particle size peak (asymptote) of the second Gaussian curve. At least 90 weight percent of the particles are in a range of 10–600 nanometers. Particle size is intended to mean the largest dimension (height, length or width) of the particle.

According to the present invention, the oxide particles used for polishing exhibit at least two Gaussian curves, either adjacent or overlapping one another, preferably adjacent. Each Gaussian curve is further defined according to the following characteristics. The median particle size of a first Gaussian curve is at least 10% less than the median particle size of a second Gaussian curve. Preferably, at least 99.5 weight percent of the particles represented by each Gaussian curve has a particle size of "X" nm, and the distribution of particle sizes is controlled to within "Y" nm, and if the particles used comprise alumina, then "Z" percent (%) of the alumina is in the alpha phrase, where:

"X" is 10–600 nm, such as 10, 20, 30, 40 or 50 nm, and is preferably no greater than 500 nm; and "Y" is approximately "P" percent of "X", where "P" is 10%, 20%, 30%, 40% or 50%, and is preferably no greater than 50% to ensure a narrow (Gaussian) distribution of particles sizes about "X";

"Z" is at least 50%, including at least 60%, 70%, 80% and 90%, and as high as 100%.

A quality factor "Q" is inversely related to "Y", and is a measure of the distribution of particle sizes. "Q" can be calculated as the concentration of particles at the desired size "X", divided by the range of sizes of particles at 3 db (decibels) lower than "X". Preferably, each Gaussian curve which represents slurry particles of the present invention exhibits a "Q" of at least 10, including 10, 50, 100, 500, 1000, 5000 or 10,000 ("Q" is dimensionless).

According to the invention, oxide particles exhibiting the aforementioned characteristics are used for planarizing a layer of a semiconductor device, such as an interlevel dielectric layer, a polyimide film, or a plasma etched CVD TEOS. Dielectric layers which can be polished using the oxide particles of this invention include, but are not limited to, polymeric low k dielectrics and silicon dioxide.

According to the invention, oxide particles exhibiting the aforementioned characteristics are used for stripping away a top metal layer, which may or may not have been defectively applied to the semiconductor device. Metal layers to which oxide particles of this invention might be applied include, but are not limited to, tungsten, aluminum, and copper.

According to the invention, oxide particles exhibiting the aforementioned characteristics are advantageous for use in polishing semiconductor devices because they can be supplied in a neutral state, then made more acidic or basic at will, depending upon the layer to be polished. For maximum performance in polishing thermal oxide, a pH of 10.5 to 11 is desirable. For polishing metals pH's as low as 3.0 to 3.5 are preferred.

For acidification, aluminum oxide particles exhibiting the aforementioned characteristics are generally superior to colloidal silica, since acidification of colloidal silica often results in flocculation. Aluminum oxide generally remains in suspension under a wide range of pH's.

For polishing an aluminum layer, it is preferred to acidify aluminum oxide exhibiting the aforementioned characteristics with zinc sulfate. Increased acidification with alum is preferred. Glacial acetic acid is recommended for polishing other materials.

In a preferred embodiment, maintaining a high "Q" range of high percentage alpha phase aluminum oxide particles ensures superior polishing. For example, particles significantly larger than "X" tend to scratch the surface being polished, and particles significantly smaller than "X" are less effective in polishing and tend to dilute the slurry with relatively useless material.

In an alternate embodiment of the invention, gamma aluminum oxide is substituted for the alpha aluminum oxide described above.

In yet another embodiment of the invention, a colloidal suspension of amorphous silica is substituted for the alpha aluminum oxide described above.

Figure 1A:
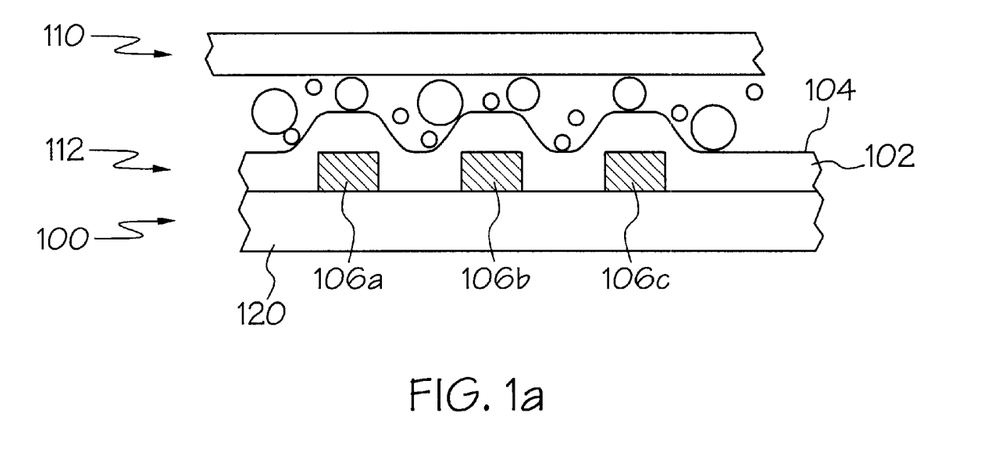
FIG. 1a is a cross-sectional view of a semiconductor device being polished, according to the present invention.

FIG. 1a shows an in-process semiconductor device 100 having a layer 102 exhibiting a non-planar top surface 104. For example, the layer 102 is an interlevel dielectric layer (ILD) overlying a metal layer 106 having topological features such as conductive lines 106a, 106b, 106c. Prior to forming vias (not shown) through the ILD layer 102, it is desirable to planarize the top surface 104 of the layer 102. Hence, FIG. 1a shows a polishing pad 110 positioned to planarize the top surface 104 of the layer 102. A medium 112 containing particles (shown as circles "o") of alpha aluminum oxide is interposed between the polishing pad 110 and the top surface 104 of the layer 102. The layers 102 and 104 are formed atop a substrate 120.

Figure 1B:
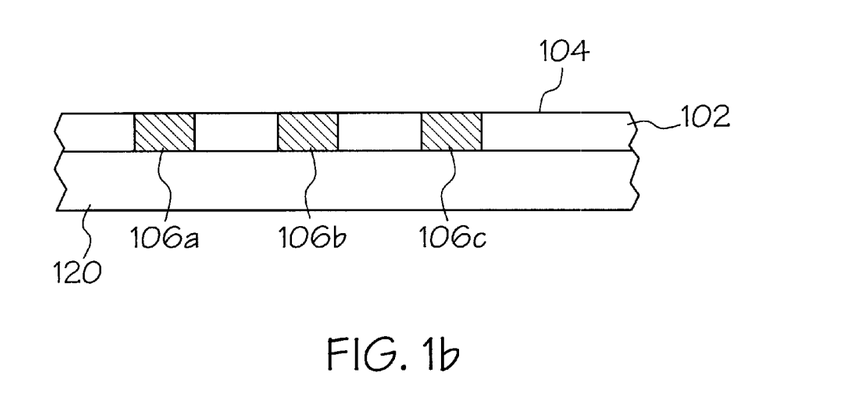
FIG. 1b is a cross-sectional view of the semiconductor device of FIG. 1a, after polishing.

FIG. 1b shows the semiconductor device 100 of FIG. 1a, after polishing. As shown, the top surface 104 of the layer 102 is substantially planar.

Figure 2A:
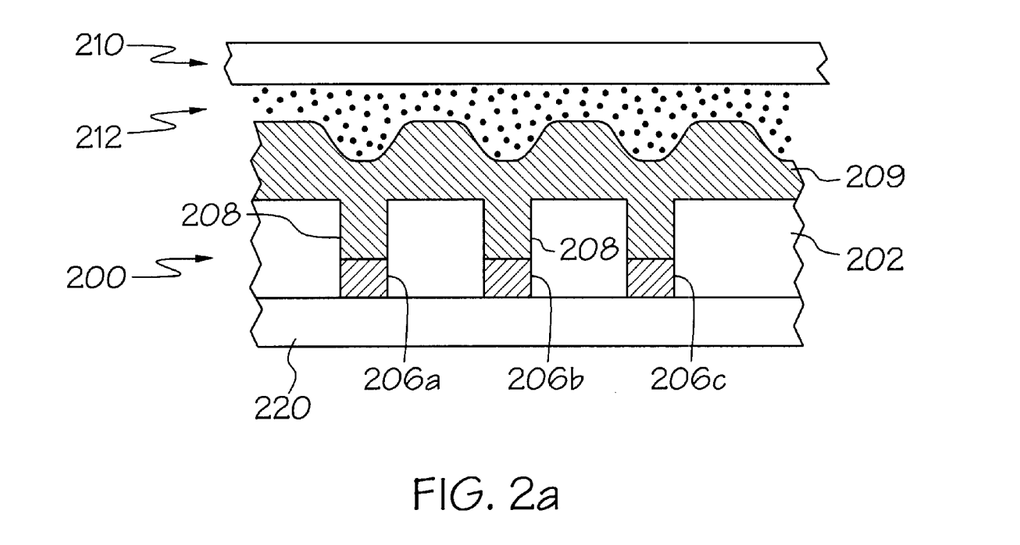
FIG. 2a is a cross-sectional view of a semiconductor device being polished, according to the present invention.

FIG. 2a shows an in-process semiconductor device 200 having a thick interleveled dielectric (ILD) layer 202 overlying a patterned metal layer 206 having conductive lines 206a, 206b and 206c. Vias 208 are formed through the ILD layer 202, in line with selected conductors 206a, b, c. A layer of metal 209 is applied over the ILD 202, to fill the vias 208, for interconnecting the lines 206a, b, c to a subsequent patterned layer of metal (not shown) overlying the ILD 202. At this point, it is desirable to remove the excess metal 209 overfilling the vias 208. Hence, FIG. 2a shows a polishing pad 210 positioned to remove the excess metal, while planarizing the top surface of the in-process substrate 220. A medium 212 containing particles (shown as dots "•") of alpha aluminum oxide is interposed between the polishing pad 210 and the top surface of the layer 209.

Figure 2B:
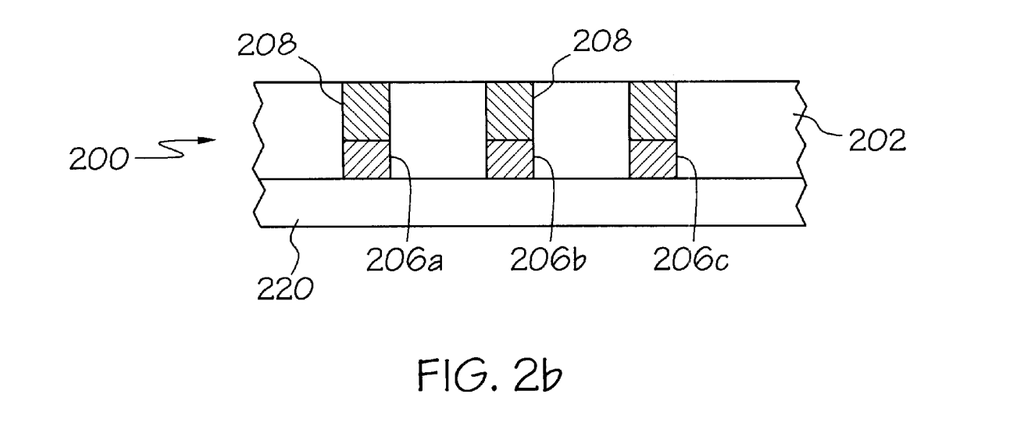
FIG. 2b is a cross-sectional view of the semiconductor device of FIG. 2a, after polishing.

FIG. 2b shows the semiconductor device 200 of FIG. 2a, after polishing. As shown, the top surface of the layer 202 is substantially planar, the vias 208 are perfectly filled with metal 209, and there is no excess metal 209 outside the vias 208.

Figure 3:
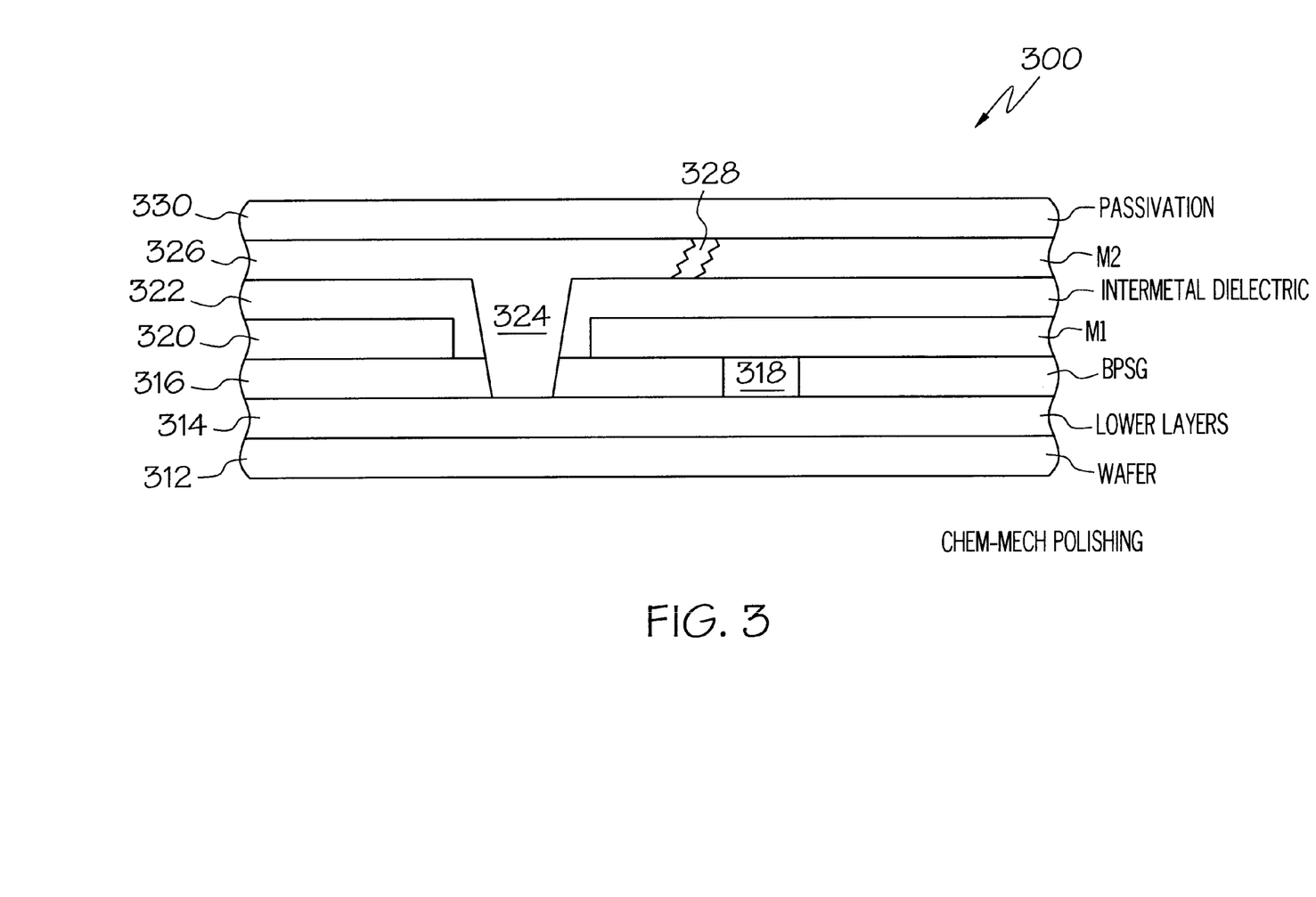
FIG. 3 is a cross-sectional view of a semiconductor device exhibiting a defect, according to the present invention.

FIG. 3 shows an idealized, substantially completed semiconductor device 300 displaying a defect. In this case open (or partially open) metallization will be discussed as a "generic" defect requiring re-working or repair of the device 300.

By way of example, in the fabrication process, the following steps proceed sequentially. First, lower layers 314 are deposited, patterned and the like on a substrate 312. The lower layers include any variety of depositions forming circuit structures, contacts and elements, as is known.

Next, by way of example, a layer 316 of Borophosphosilicate glass (BPSG) is deposited, which is a known technique for creating an intermediate planar topology for subsequent metal deposition.

Vias may be formed through the BPSG layer 316 to the lower layers 314, and filled by overlying metal. Alternatively, as shown, a tungsten plug 318 is formed atop the lower layers 314.

Next, a first, patterned metal layer ("M1") 320, formed of aluminum of an aluminum alloy, is deposited, creating a pattern of conductive lines.

Next, an intermetal insulating layer (ILD dielectric film) 322 is deposited. A via 324 is formed through the dielectric film 322 and through the BPSG layer 316 for connection of overlying metal to the lower layers 314.

Next, a second, patterned metal layer ("M2") 326, again formed of aluminum or an aluminum alloy, is deposited, creating a pattern of conductive lines and filling the via 324.

As shown, the second metal layer 326 contains a void 328, which is a manufacturing defect generally undetectable at this stage of manufacturing.

Finally, a passivation layer 330, such as phosphosilicate glass (PSG) is deposited.

The resulting, substantially completed device can now be functionally tested. Such testing is expected to reveal the existence of defect 328 and having been located and diagnosed, the task remains to strip off the passivation layer 330 and possibly the second metal layer 326 to repair or remanufacture the second metal layer, respectively. To this end, the device 310 is subjected to chemical-mechanical polishing, as in FIGS. 1a and 2a.

Figure 3A:
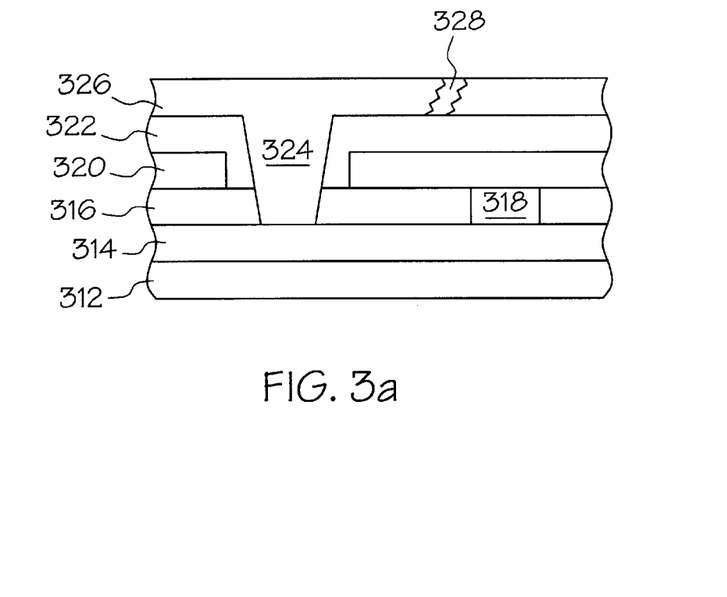
FIG. 3a is a cross-sectional view of the semiconductor device of FIG. 3, after polishing.

FIG. 3a shows the device 300 after polishing, according to one embodiment of the invention. In this embodiment, the passivation layer 330 has been stripped (polished back) to the level of the second metal layer 326. At this point, it is possible to repair the defect 328 using a focused ion beam, or other suitable repair technique.

Figure 3B:
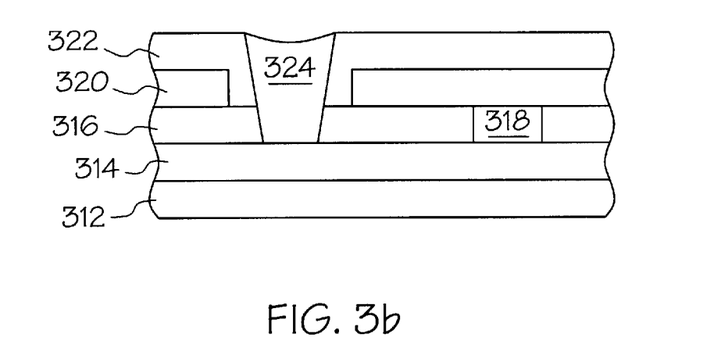
FIG. 3b is a cross-sectional view of the semiconductor device of FIG. 3, after polishing.

FIG. 3b shows the device 300 after polishing, according to another embodiment of the invention. In this embodiment, the passivation layer 330 and the second metal layer 326 have both been stripped (polished back) to the level of the intermetal dielectric film 322. It would be expected that the metal in the via 324 would disappear if it is of the same material (aluminum) as that of the second metal layer 326. If the material in the via 324 is not severely attacked, it is possible to remanufacture (re-deposit) the second metal layer (including any material removed from the via 324) and the passivation layer.

Figure 3C:
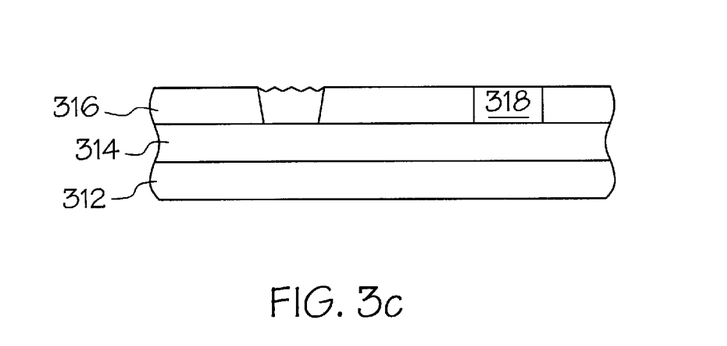
FIG. 3c is a cross-sectional view of the semiconductor device of FIG. 3, after polishing.

FIG. 3c shows the device 300 after polishing, according to yet another embodiment of the invention. In this embodiment, the passivation layer 330, the second metal layer 326, the intermetal dielectric film 322 and the first metal layer 320, in other words all of the upper layers, have been stripped (polished back) to the level of the BPSG layer 316. In this example, the tungsten plug 318 is exposed, but with most common polishing slurries (e.g., Cabot Industries Type SC-1) the tungsten will not be attacked.

Evidently, it is possible to polish back all the way to the contact level. In any case, the device 300 was substantially completely manufactured prior to polish back for repair. It is also possible that the polishing back technique could be applied at a somewhat earlier step, such as after deposition of first metal. By "substantially complete", it is meant that the fabrication of the device has proceeded to at least deposition of first metal.

Having thus described various applications for polishing semiconductor devices, there are set forth some exemplary polishing media.

EXAMPLE 1

In this example, a medium of aluminum oxide particles having a bi-modal distribution and having the following characteristics can be employed for polishing a semiconductor substrate: "X"=50 nm; "P"=50%; and "Z"=50%, an can be used for chemical-mechanical polishing, such as is set forth in any of the exemplary applications for chemical-mechanical polishing (see Figures).

EXAMPLE 2

In this example, a medium of aluminum oxide particles having a multi-modal distribution and having the following characteristics is employed for polishing a semiconductor substrate: "X"=50 nm; "Z"=50%; and "Q"=100, and is used for chemical-mechanical polishing, such as is set forth in any of the exemplary applications for chemical-mechanical polishing (see Figures).

EXAMPLE 3

In this example, a medium of aluminum oxide particles having the following characteristics can be employed for polishing a semiconductor substrate: "X"=10 nm; "P"=10%; and "Z"=90%, and can be used for chemical-mechanical polishing, such as is set forth in any of the exemplary applications for chemical-mechanical polishing (see Figures).

EXAMPLE 4

In this example, a medium of aluminum oxide particles having a bi-modal distribution and having the following characteristics can be employed for polishing a semiconductor substrate: "X"=10 nm; "Z"=90%; and "Q"=1000, and can be used for chemical-mechanical polishing, such as is set forth in any of the exemplary applications for chemical-mechanical polishing (see Figures).

EXAMPLE 5

As mentioned hereinabove, other phases of aluminum oxide, as well as silica, especially amorphous silica, can be substituted for the alpha phase, according to any of the previous examples.

Figure 6A:
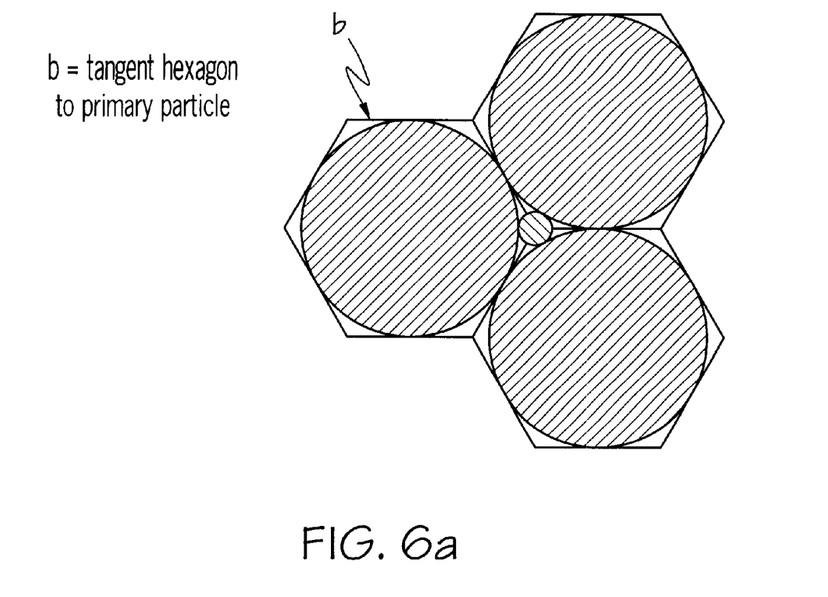
FIG. 6a is a diagram showing how secondary particles in a given size range may be too small to affect direct primary particle contact.
Figure 6B:
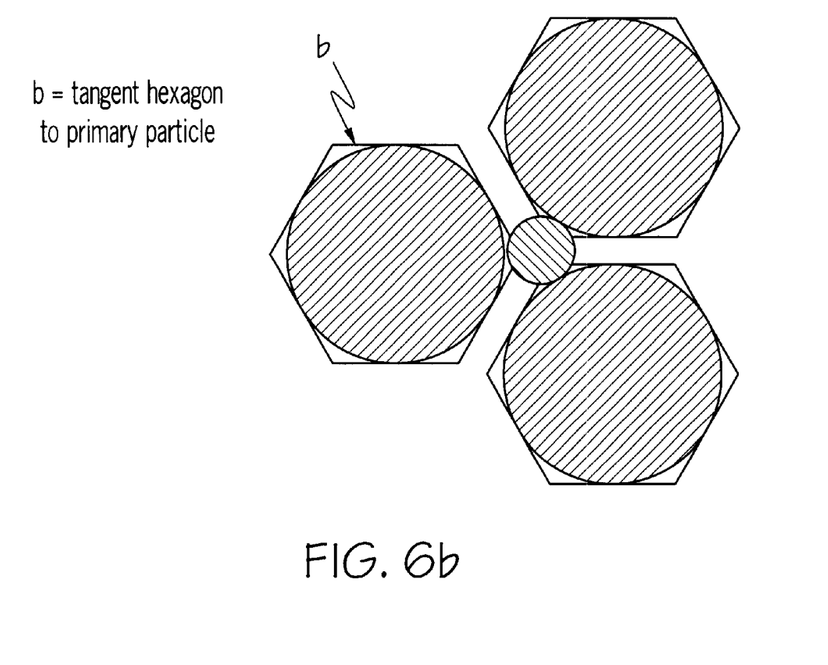
FIG. 6b is a diagram showing how secondary particles in a given size range may minimize direct primary particle contact.

As shown in FIG. 6 it is believed that certain slurries of the invention may minimize direct primary particle contact and thereby inhibit particle agglomeration and the negative effects in polishing due to very large particles. As shown in FIG. 6a, if the radius, r', of the secondary (smaller) particle is equal to or less than 0.1546 times the radius, r, of the primary (larger) particle, tangent packing is allowed and primary particles are likely to contact each other. If the radius of the secondary particle is greater than 0.1546 times the radius of the primary particles, one can see by the diagram shown as FIG. 6b that direct primary particle contact is inhibited.

What is claimed is:

1. A ploishing composition for removing by chemical-mechanical polishing excess material from an in-process semiconductor layer, said composition comprising a plurality of metal oxide particles having a multi-modal size distribution including particles of a first size defining a first size distribution curve having a first asymptote and particles of a second size defining a second size distribution curve having a second asymptote, wherein a particle size at the first asymptote is at least 10% less than a particle size at the second asymptote, and the plurality of metal oxide particles having a size "X" and a size distribution "Y", wherein "X" is 10–500 nm and "Y" is "P" percent of "X", where "P" is at most 50%.

2. The composition according to claim 1, wherein:
"X"=10–400 nm.

3. The composition according to claim 2, wherein:
"X"=10–300 nm.

4. The composition according to claim 3, wherein:
"X"=10–100 nm.

5. The composition according to claim 1, wherein:
"X"=50 nm; and
"P"=50%, wherein "Y"=25 nm.

6. The composition according to claim 1, wherein:
"X"=10 nm; and
"P"=10%, wherein "Y"=1 nm.

7. The composition according to claim 1, wherein:
"X"/"Y"=1.1 to 50.

8. The composition according to claim 7, wherein:
"X"/"Y"=1.1 to 30.

9. The composition according to claim 8, wherein:
"X"/"Y"=1.1 to 10.

10. The composition according to claim 1, wherein:
said metal oxide particles are from the group consisting of alumina, silica, ceria, titania, and mixtures thereof.

11. The composition according to claim 10, wherein:
said metal oxide particles are alumina.

12. The composition according to claim 10, wherein:
said metal oxide particles are silica.

13. The composition according to claim 10, wherein:
said metal oxide particles are ceria.

14. The composition according to claim 10, wherein:
said metal oxide particles are titania.

15. The composition according to claim 1, wherein:
said composition has a pH of 10.5 to 11.

16. The composition according to claim 1, wherein:
said composition has a pH of 3.0 to 3.5.

17. In a polishing slurry for chemical-mechanical polishing to remove excess material from an in-process semiconductor layer, the slurry having slurry particles, and the slurry particles having sizes distributed according to a bimodal size distribution, the improvement comprising:

the sizes of the slurry particles being distributed according to the bimodal size distribution having a $1^{st}$ mode of size distribution defining a $1^{st}$ peak size and a $2^{nd}$ mode of size distribution defining a $2^{nd}$ peak size, the $1^{st}$ peak size being at least 10% less than the $2^{nd}$ peak size, and the $2^{nd}$ peak size being "X", wherein "X" is in the range, 10–100 nm, and the sizes of the slurry particles being within a "Y" distribution from either the $1^{st}$ peak size or the $2^{nd}$ peak size, wherein "Y" is "P" percent of "X", and wherein "P" is at most 50%.

18. The slurry as recited in claim 17 wherein "X" is 10 nm.

19. The slurry as recited in claim 17 wherein "X" is 10–20 nm.

20. The slurry as recited in claim 17 wherein "X" is 20–30 nm.

21. The slurry as recited in claim 17 wherein "X" is 30–40 nm.

22. The slurry as recited in claim 17 wherein "X" is 40–50 nm.

* * * * *